(12) United States Patent
Yamashita

(10) Patent No.: US 11,557,527 B2
(45) Date of Patent: Jan. 17, 2023

(54) SEMICONDUCTOR DEVICE AND METHOD OF MANUFACTURING RADIATION FIN

(71) Applicant: Mitsubishi Electric Corporation, Tokyo (JP)

(72) Inventor: Hiroto Yamashita, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 105 days.

(21) Appl. No.: 17/002,946

(22) Filed: Aug. 26, 2020

(65) Prior Publication Data

US 2021/0159145 A1 May 27, 2021

(30) Foreign Application Priority Data

Nov. 26, 2019 (JP) .............................. JP2019-213339

(51) Int. Cl.
*H01L 23/40* (2006.01)
*H01L 21/48* (2006.01)

(52) U.S. Cl.
CPC .......... *H01L 23/40* (2013.01); *H01L 21/4882* (2013.01)

(58) Field of Classification Search
None
See application file for complete search history.

(56) References Cited

U.S. PATENT DOCUMENTS

| 2008/0273308 A1* | 11/2008 | Kells ........................ H01L 23/40 361/704 |
| 2012/0014068 A1* | 1/2012 | Nakanishi ............... H01L 23/40 361/717 |
| 2012/0120608 A1* | 5/2012 | Guan .................. H05K 7/20172 361/704 |
| 2014/0174705 A1* | 6/2014 | Chang .................. H01L 23/3672 165/185 |
| 2015/0102474 A1 | 4/2015 | Kimura |
| 2016/0143127 A1* | 5/2016 | Yeh ...................... H05K 1/0209 174/252 |
| 2019/0115281 A1* | 4/2019 | Lee ........................ H01L 23/427 |

FOREIGN PATENT DOCUMENTS

JP H04-94154 A 3/1992
JP H09-283675 A 10/1997

OTHER PUBLICATIONS

An Office Action issued by the German Patent and Trade Mark Office dated Aug. 23, 2022, which corresponds to German Patent Application No. 102020127682.6 and is related to U.S. Appl. No. 17/002,946; with English language translation.

* cited by examiner

*Primary Examiner* — Benjamin P Sandvik
(74) *Attorney, Agent, or Firm* — Studebaker & Brackett PC

(57) ABSTRACT

An object is to provide a technique capable of suppressing reduction in sticking force of a semiconductor package and a radiation fin in a semiconductor device including the semiconductor package and the radiation fin when the semiconductor package and the radiation fin stick and are fixed to each other by magnetic force. A semiconductor device includes: a semiconductor package; an insulating substrate; a radiation fin; a first fixed part made up of one of a magnetic body and a bond magnet integrally formed with the semiconductor package; and a second fixed part made up of another one of the magnetic body and the bond magnet integrally formed with the radiation fin, wherein the semiconductor package and the radiation fin stick to each other by magnetic force occurring between the first fixed part and the second fixed part.

5 Claims, 4 Drawing Sheets

SEMICONDUCTOR DEVICE AND METHOD OF MANUFACTURING RADIATION FIN

BACKGROUND OF THE INVENTION

Field of the Invention

The present invention relates to a semiconductor device an a method of manufacturing a radiation fin.

Description of the Background Art

Conventionally, screw fastening is generally known as a method of attaching a semiconductor package to a radiation fin in a semiconductor device. However, in the attaching method by screw fastening, a screw fastening part is deteriorated and broken in some cases due to a stress occurring by a thermal expansion difference at an interface between the semiconductor package and the radiation fin.

An attaching method using a sticking phenomenon by magnetic force is proposed in Japanese Patent Application Laid-Open No. 9-283675, for example, as a method of solving such a problem.

In a technique described in Japanese Patent Application Laid-Open No. 9-283675, a magnet attaching hole is provided on an upper side near an outer periphery of ceramics supporting both shoulder portions of a metal plate, which is provided with an LSI on a lower surface, from a lower side, and a magnet having an upper surface with the same height as a surface of the ceramics is embedded therein and fixed by an adhesive agent. A magnetic body is attached to a position facing the magnet in a lower surface of a radiation fin by an adhesive agent. The upper surface of the magnet embedded in the ceramics and a lower surface of the magnetic body attached to the radiation fin stick to each other, thus a base part including the ceramics is attached to a heat sink part including the radiation fin.

As described above, in the technique described in Japanese Patent Application Laid-Open No. 9-283675, the magnet and the magnetic body are bonded to the ceramics and the radiation fin using the adhesive agent, respectively. However, in a case of the manufacturing method using the adhesive agent, a management of thick variation of the adhesive agent is important. When the management of the thickness variation of the adhesive agent cannot be accurately performed, a height position of the upper surface of the magnet with respect to an upper surface of the ceramics and a height position of the lower surface of the magnetic body with respect to the lower surface of the radiation fin are varied. As a result, there is a problem that a difference occurs in height positions of sticking surfaces of the ceramics and the radiation fin, and sticking force of the ceramics and the radiation fin decreases.

SUMMARY

An object is of the present invention to provide a technique capable of suppressing reduction in sticking force of a semiconductor package and a radiation fin in a semiconductor device including the semiconductor package and the radiation fin when the semiconductor package and the radiation fin stick and are fixed to each other by magnetic force.

A semiconductor device according to the present invention includes a semiconductor package, an insulating substrate, a radiation fin, a first fixed part, and a second fixed part. The insulating substrate is located on an inner side of an outer peripheral part of an upper surface of the semiconductor package. The radiation fin is disposed on the upper surface of the semiconductor package. The first fixed part is located on the outer peripheral part of the upper surface of the semiconductor package and made up of one of a magnetic body and a bond magnet integrally formed with the semiconductor package. The second fixed part is located in a position facing the first fixed part in a lower surface of the radiation fin and made up of another one of the magnetic body and the bond magnet integrally formed with the radiation fin. The semiconductor package and the radiation fin stick to each other by magnetic force occurring between the first fixed part and the second fixed part.

The bond magnet is used as the magnet provided in one of the semiconductor package and the radiation fin, thus an integral formation of the bond magnet and one of the semiconductor package and the radiation fin can be achieved. The magnetic body is integrally formed with the other one of the semiconductor package and the radiation fin. An adhesive agent is not used for fixing the bond magnet to one of the semiconductor package and the radiation fin and fixing the magnetic body to the other one of the semiconductor package and the radiation fin, thus there is no need to manage the height positions of sticking surfaces of the semiconductor package and the radiation fin. As a result, the height positions of the sticking surfaces of the semiconductor package and the radiation fin can be easily managed, thus reduction in sticking force between the semiconductor package and the radiation fin can be suppressed.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
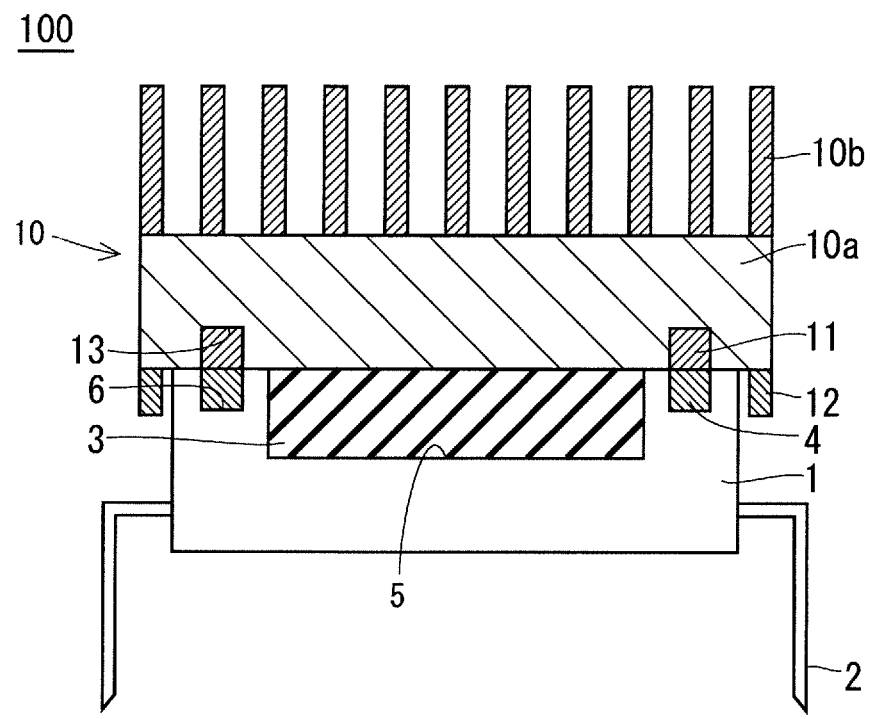
FIG. 1 is a cross-sectional view of a semiconductor device according to an embodiment 1.

An embodiment 1 of the present invention is described hereinafter using the drawings. FIG. 1 is a cross-sectional view of a semiconductor device 100 according to the embodiment 1.

As illustrated in FIG. 1, the semiconductor device 100 includes a semiconductor package 1, an insulating substrate 3, a radiation fin 10, a magnetic body 4, and a bond magnet 11.

The semiconductor package 1 includes a lead terminal 2 provided on a lower end portion thereof to be connected to an electronic substrate (not shown in the drawings). A concave portion 5 concaved downward is formed on an inner side of an outer peripheral part of an upper surface of the semiconductor package 1. The insulating substrate 3, which is housed in the concave portion 5, is mold-sealed together with a lead terminal provided with a semiconductor chip not shown and connected thereto. An upper surface of the insulating substrate 3 is located on an inner side of the outer peripheral part of the upper surface of the semiconductor package 1, and has contact with a lower surface of the radiation fin 10.

A concave portion 6 concaved downward to surround the insulating substrate 3 is formed into a rectangular frame shape on an outer peripheral part of an upper side of the semiconductor package 1. The magnetic body 4 is also formed into a rectangular frame shape to correspond to the concave portion 6, and is housed in the concave portion 6 to be integrally formed with the concave portion 6. An upper surface of the magnetic body 4 is located on the outer peripheral part of the upper surface of the semiconductor package 1, and has contact with a lower surface of the bond magnet 11 located on the lower surface of the radiation fin 10.

The radiation fin 10 is located on the upper surface of the semiconductor package 1, and radiates heat of the semiconductor package 1 transmitted via the insulating substrate 3 toward the outside.

The radiation fin 10 includes a body part 10a, a fin part 10b, and a pair of guide rails 12. The body part 10a is a flat plate-like member having contact with the upper surface of the semiconductor package 1, specifically, the upper surface of the insulating substrate 3 embedded in the semiconductor package 1. The fin part 10b has a plurality of protrusions and is joined to an upper surface of the body part 10a.

The pair of guide rails 12 are provided on an outer end of a lower surface of the body part 10a, and regulates a position of the radiation fin 10 with respect to the semiconductor package 1. The pair of guide rails 12 are provided to suppress a misalignment of the radiation fin 10 with respect to the semiconductor package 1, in other words, a misalignment of the semiconductor package 1 with respect to the radiation fin 10. There is a predetermined gap between the pair of guide rails 12 and an outer end of the semiconductor package 1 in a lateral direction to reduce a stress occurring by a thermal expansion difference between the radiation fin 10 and the semiconductor package 1.

A concave portion 13 having a rectangular frame shape concaved upward is formed in a position facing the magnetic body 4 in the body part 10a. The bond magnet 11 having a rectangular frame shape is housed in the concave portion 13, and is integrally formed with the body part 10a. The lower surface of the bond magnet 11 is located in a position facing the magnetic body 4 on the lower surface of the radiation fin 10, and has contact with the upper surface of the magnetic body 4 located on the upper surface of the semiconductor package 1. Herein, the magnetic body 4 corresponds to a first fixed part, and the bond magnet 11 corresponds to a second fixed part.

Figure 2:
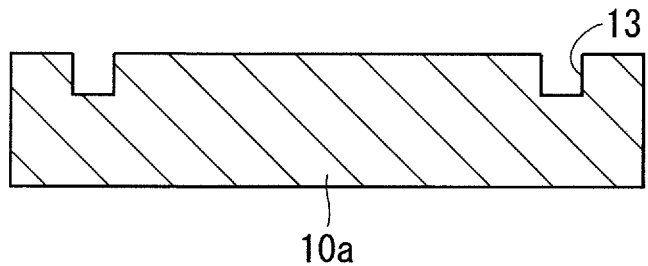
FIG. 2 is a cross-sectional view for describing a process of extrusion processing.
Figure 3:
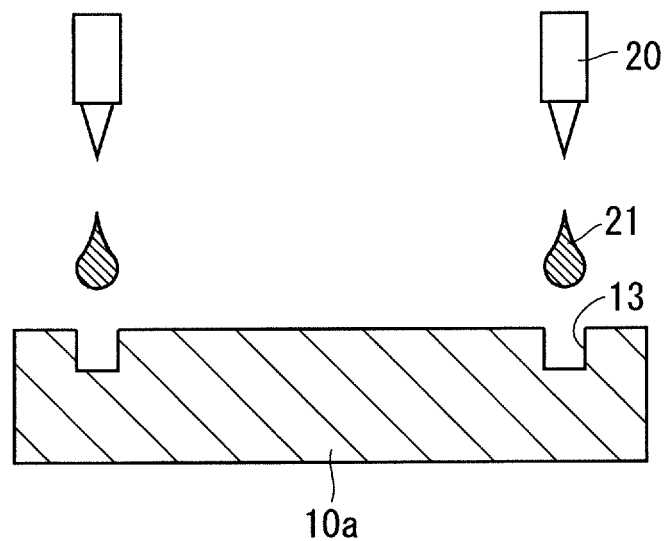
FIG. 3 is a cross-sectional view for describing a melt injection process.
Figure 4:
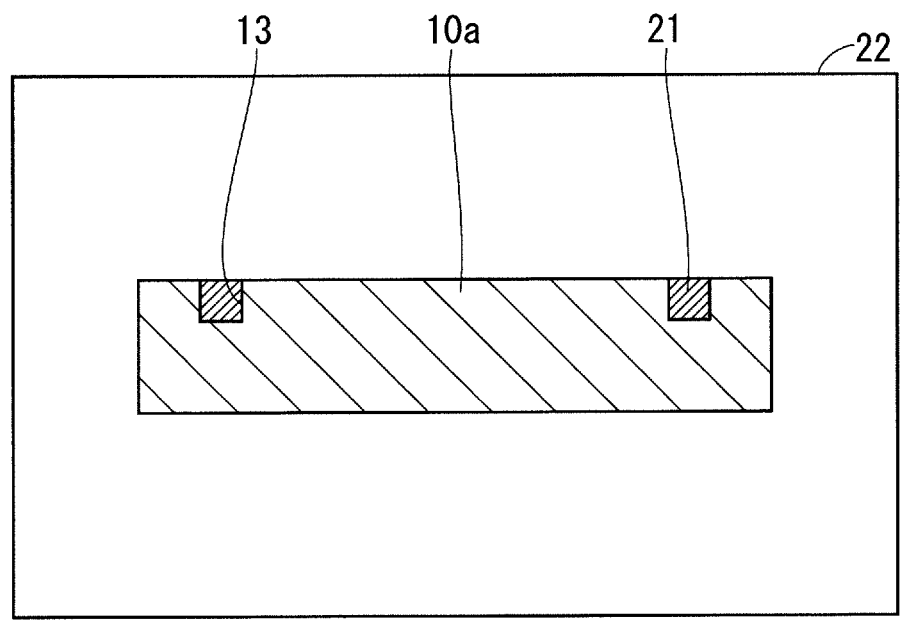
FIG. 4 is a cross-sectional view for describing a cooling process.
Figure 5:
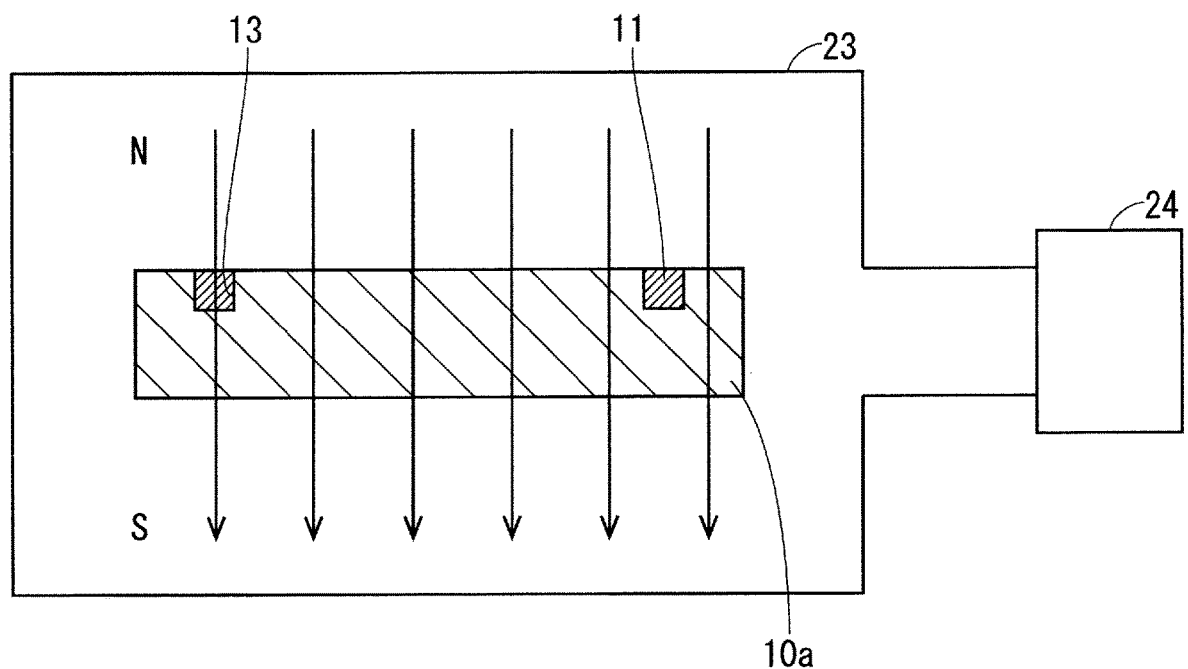
FIG. 5 is a cross-sectional view for describing a magnetizing process.
Figure 6:
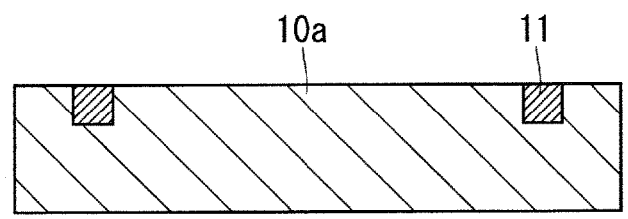
FIG. 6 is a cross-sectional view for describing a surface polishing process.
Figure 7:
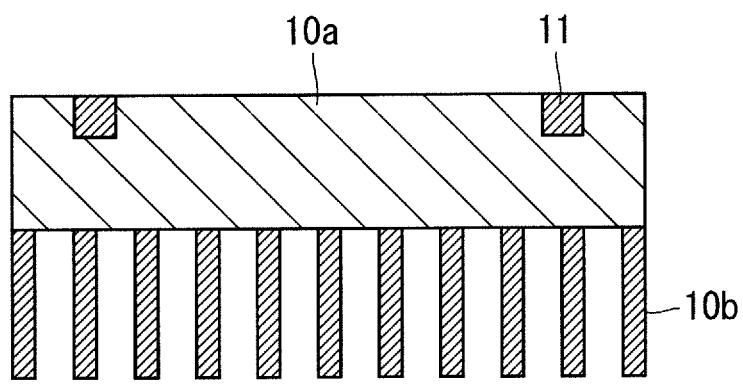
FIG. 7 is a cross-sectional view for describing a fin part joining process.

Next, a method of manufacturing the radiation fin 10 is described using FIG. 2 to FIG. 7. FIG. 2 is a cross-sectional view for describing a process of extrusion processing. FIG. 3 is a cross-sectional view for describing a melt injection process. FIG. 4 is a cross-sectional view for describing a cooling process. FIG. 5 is a cross-sectional view for describing a magnetizing process. FIG. 6 is a cross-sectional view for describing a surface polishing process. FIG. 7 is a cross-sectional view for describing a fin part attaching process.

Firstly, as illustrated in FIG. 2, an extrusion process is performed on the body part 10a of the radiation fin 10 to form the concave portion 13 in which the bond magnet 11 is formed. Next, as illustrated in FIG. 3, a kneading material 21 containing magnet pieces and a thermoplastic resin is melt-injected into the concave portion 13 by a dispenser 20. The magnet pieces are minute magnetic particles or a magnetic powder.

Next, as illustrated in FIG. 4, the body part 10a is set in a cooler 22 and the kneading material 21 melt-injected into the concave portion 13 is cooled and hardened, thus the bond magnet 11 is integrally formed with the body part 10a. The body part 10a is pulled out of the cooler 22, and as illustrated in FIG. 5, the body part 10a is set in a magnetic field generation coil 23 connected to a magnetizing power source 24. Then, the bond magnet 11 integrally formed with the body part 10a is magnetized.

When the magnetization is completed, the body part 10a is pulled out of the magnetic field generation coil 23, and as illustrated in FIG. 6, a surface of the body part 10a is polished to be flattened. Next, as illustrated in FIG. 7, the fin part 10b is joined to the body part 10a by brazing, for example, to improve a heat radiation performance of the radiation fin 10. If there is no need to improve the heat radiation performance of the radiation fin 10, this process can be omitted.

In consideration of easiness of manufacturing process, the bond magnet 11 is preferably integrally formed with the radiation fin 10 as the present embodiment, however, if the easiness of manufacturing process needs not be considered, the bond magnet 11 may be integrally formed with the semiconductor package 1. In this case, the magnetic body 4 facing the bond magnet 11 is integrally formed with the radiation fin 10. Herein, the bond magnet 11 corresponds to the first fixed part, and the magnetic body 4 corresponds to the second fixed part.

In the present embodiment, each of the bond magnet 11 and the magnetic body 4 has the rectangular frame shape, but may be made up of a linear member provided in a position corresponding to each side of the insulating substrate 3. Alternatively, the bond magnet 11 and the magnetic body 4 may be made up of a plurality of rectangular parallelepiped members each provided in a position corresponding to each side of the insulating substrate 3. In these cases, the concave portions 6 and 13 are formed in conformity with the shapes of the bond magnet 11 and the magnetic body 4.

As described above, the semiconductor device 100 according to the embodiment 1 includes: the semiconductor package 1; the insulating substrate 3 on the inner side of the outer peripheral part of the upper surface of the semiconductor package 1; the radiation fin 10 disposed on the upper surface of the semiconductor package 1; the first fixed part located on the outer peripheral part of the upper surface of the semiconductor package 1 and made up of one of the magnetic body 4 and the bond magnet 11 integrally formed with the semiconductor package 1; and the second fixed part located in the position facing the first fixed part in the lower surface of the radiation fin 10 and made up of the other one of the magnetic body 4 and the bond magnet 11 integrally formed with the radiation fin 10, wherein the semiconductor package 1 and the radiation fin 10 stick to each other by the magnetic force occurring between the first fixed part and the second fixed part.

The bond magnet 11 is used as the magnet provided in one of the semiconductor package 1 and the radiation fin 10, thus the integral formation of the bond magnet 11 and one of the semiconductor package 1 and the radiation fin 10 can be achieved. The magnetic body 4 is integrally formed with the other one of the semiconductor package 1 and the radiation fin 10. An adhesive agent is not used for fixing the bond magnet 11 to one of the semiconductor package 1 and the radiation fin 10 and fixing the magnetic body 4 to the other one of the semiconductor package 1 and the radiation fin 10, thus there is no need to manage the height positions of sticking surfaces of the semiconductor package 1 and the radiation fin 10. As a result, the height positions of the sticking surfaces of the semiconductor package 1 and the radiation fin 10 can be easily managed, thus reduction in sticking force between the semiconductor package 1 and the radiation fin 10 can be suppressed.

The bond magnet 11 and one of the semiconductor package 1 and the radiation fin 10 are integrally formed and the magnetic body 4 and the other one of the semiconductor package 1 and the radiation fin 10 are integrally formed, thus a used amount of the adhesive agent in the process of manufacturing the semiconductor device 100 is reduced, and an amount of raw materials can be reduced.

The first fixed part is made up of the magnetic body 4, and the second fixed part is made up of the bond magnet 11. The method of manufacturing the radiation fin 10 in this case includes: (a) performing extrusion processing on the body part 10a of the radiation fin 10 to form the concave portion 13 in which the bond magnet 11 is formed; (b) melt-injecting the kneading material 21 containing the magnetic pieces and the thermoplastic resin into the concave portion 13; (c) cooling and hardening the kneading material 21 melt-injected into the concave portion 13 to form the bond magnet 11 to be integral with the body part 10a; and (d) magnetizing the bond magnet 11 integrally formed with the body part 10a.

Accordingly, a process of bonding the radiation fin and the magnet, which has been conventionally necessary, is unnecessary, thus productivity of the semiconductor device 100 is improved. The adhesive agent is unnecessary in fixing the radiation fin 10 and the bond magnet 11, thus there is also no need to manage the thickness variation of the adhesive agent and the variation of the height position of the sticking surface of the radiation fin 10. Accordingly, the height positions of the sticking surfaces of the semiconductor package 1 and the radiation fin 10 can be easily uniformized, thus the magnetic force effectively acts between the bond magnet 11 and the magnetic body 4, and the sticking force of the semiconductor package 1 and the radiation fin 10 is increased.

Embodiment 2

Figure 8:
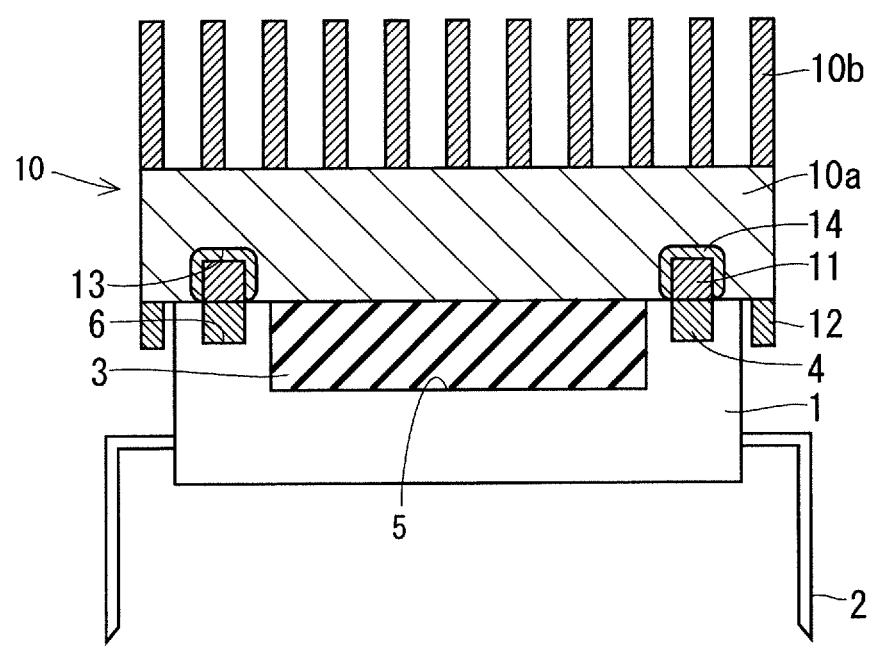
FIG. 8 is a cross-sectional view of a semiconductor device according to an embodiment 2.

Next, a semiconductor device 100A according to an embodiment 2 is described. FIG. 8 is a cross-sectional view of a semiconductor device 100A according to the embodiment 2. In the embodiment 2, the same reference numerals are assigned to the same constituent elements described in the embodiment 1, and the description thereof will be omitted.

As illustrated in FIG. 8, in the embodiment 2, the semiconductor device 100A further includes a yoke 14 disposed around the bond magnet 11 in the radiation fin 10.

The yoke 14 has a U shape in a cross-sectional view to cover the bond magnet 11 except for the lower surface thereof, and extends along an extension direction of the bond magnet 11, thereby suppressing a diffusion of magnetic line occurring between the bond magnet 11 and the magnetic body 4. A soft magnetic body such as iron, nickel, cobalt, permalloy, or silicon copper is mainly used as a material of the yoke 14.

Next, a method of manufacturing the radiation fin 10 is described. Described herein is only a melt injection process different from the case of the embodiment 1, and the other process is the same as that of the embodiment 1, thus the description thereof is omitted.

In the melt injection process, the yoke 14 is fitted and fixed to the concave portion 13, for example, without an adhesive agent, and subsequently, the kneading material 21 is melt-injected into the yoke 14, thus the bond magnet 11 is integrally formed with the yoke 14. As a result, the radiation fin 10, the yoke 14, and the bond magnet 11 are fixed to each other without the adhesive agent.

As described above, the semiconductor device 100A according to the embodiment 2 further includes the yoke 14 disposed around the bond magnet 11 in the radiation fin 10.

Accordingly, the diffusion of magnetic line occurring between the bond magnet 11 and the magnetic body 4 is suppressed, thus an electrical influence on an area around the semiconductor device 100A is suppressed and stronger sticking force can be obtained between the semiconductor package 1 and the radiation fin 10.

According to the present invention, the above embodiments can be arbitrarily combined, or each embodiment can be appropriately varied or omitted within the scope of the invention.

What is claimed is:

1. A semiconductor device, comprising:
a semiconductor package;
an insulating substrate located on an inner side of an outer peripheral part of an uppermost surface of the semiconductor package;
a radiation fin disposed on the uppermost surface of the semiconductor package;
a first fixed part located in a first concave portion positioned within the outer peripheral part of the uppermost surface of the semiconductor package and made up of one of a magnetic body and a bond magnet integrally formed with the semiconductor package; and
a second fixed part located in a position facing the first fixed part in a second concave portion positioned within a lower surface of the radiation fin, the second fixed part being made up of another one of the magnetic body and the bond magnet and being integral with the radiation fin without an additional adhesive agent between the radiation fin and the second fixed part, wherein
the semiconductor package and the radiation fin stick to each other by magnetic force occurring between the first fixed part and the second fixed part.

2. The semiconductor device according to claim 1, wherein
the first fixed part is made up of the magnetic body and the second fixed part is made up of the bond magnet.

3. The semiconductor device according to claim 1, wherein
the radiation fin includes a pair of guide rails regulating a position of the radiation fin with respect to the semiconductor package, and
a predetermined gap is located between the pair of guide rails and an outer end of the semiconductor package in a lateral direction.

4. The semiconductor device according to claim 2, further comprising
a yoke disposed around the bond magnet in the radiation fin.

5. A method of manufacturing a radiation fin included in a semiconductor device comprising: a semiconductor package; an insulating substrate located on an inner side of an outer peripheral part of an upper surface of the semiconductor package; a radiation fin disposed on the upper surface of the semiconductor package; a first fixed part located on the outer peripheral part of the upper surface of the semiconductor package and made up of one of a magnetic body and a bond magnet integrally formed with the semiconductor package; and a second fixed part located in a position facing the first fixed part in a lower surface of the radiation fin and made up of another one of the magnetic body and the bond magnet integrally formed with the radiation fin, wherein the semiconductor package and the radiation fin stick to each other by magnetic force occurring between the first fixed part and the second fixed part, and the first fixed part is made up of the magnetic body and the second fixed part is made up of the bond magnet, the method comprising:
 (a) performing extrusion processing on a body part of the radiation fin to form a concave portion in which the bond magnet is formed;
 (b) melt-injecting a kneading material containing magnetic pieces and a thermoplastic resin into the concave portion;
 (c) cooling and hardening the kneading material melt-injected into the concave portion to form the bond magnet to be integral with the body part; and
 (d) magnetizing the bond magnet integrally formed with the body part.

* * * * *